United States Patent
Tsurusaki

(10) Patent No.: US 9,060,438 B2
(45) Date of Patent: Jun. 16, 2015

(54) ELECTRONIC DEVICE AND MOBILE TERMINAL INCLUDING THE SAME

(75) Inventor: Kouji Tsurusaki, Kirishima (JP)

(73) Assignee: Kyocera Corporation, Kyoto (JP)

( * ) Notice: Subject to any disclaimer, the term of this patent is extended or adjusted under 35 U.S.C. 154(b) by 174 days.

(21) Appl. No.: 13/978,946

(22) PCT Filed: Dec. 21, 2011

(86) PCT No.: PCT/JP2011/079640
§ 371 (c)(1),
(2), (4) Date: Jul. 10, 2013

(87) PCT Pub. No.: WO2012/096113
PCT Pub. Date: Jul. 19, 2012

(65) Prior Publication Data
US 2013/0286572 A1   Oct. 31, 2013

(30) Foreign Application Priority Data

Jan. 15, 2011 (JP) .................................. 2011-006517

(51) Int. Cl.
*H05K 5/00* (2006.01)
*H05K 7/14* (2006.01)
*G06F 3/041* (2006.01)

(52) U.S. Cl.
CPC . *H05K 7/14* (2013.01); *G06F 3/041* (2013.01)

(58) Field of Classification Search
CPC ... G06F 1/1616; G06F 1/1626; G06F 1/1656; G06F 2200/1633; G06F 2200/1634
See application file for complete search history.

(56) References Cited

U.S. PATENT DOCUMENTS

| | | | |
|---|---|---|---|
| 7,920,225 B2 * | 4/2011 | Nishikawa et al. | 349/60 |
| 2003/0067449 A1 | 4/2003 | Yoshikawa et al. | |
| 2010/0053854 A1 * | 3/2010 | Nishikawa et al. | 361/679.01 |
| 2011/0102342 A1 * | 5/2011 | Iwawaki et al. | 345/173 |
| 2013/0222319 A1 * | 8/2013 | Tsurusaki | 345/173 |
| 2013/0335211 A1 * | 12/2013 | Kobayashi | 340/407.2 |
| 2014/0177154 A1 * | 6/2014 | Lee et al. | 361/679.26 |

FOREIGN PATENT DOCUMENTS

| | | |
|---|---|---|
| JP | 2003122507 A | 4/2005 |
| JP | 2005242501 A | 9/2005 |
| JP | 2006209360 A | 8/2006 |
| WO | 2007091600 A1 | 8/2007 |

OTHER PUBLICATIONS

International Search Report, PCT/JP2011/079640, Feb. 17, 2012, 4 pp.

* cited by examiner

*Primary Examiner* — Robert J Hoffberg
*Assistant Examiner* — Hung Dang
(74) *Attorney, Agent, or Firm* — Volpe and Koenig, P.C.

(57) ABSTRACT

According to one aspect of the present invention, an electronic device includes an operation plate, a supporting plate which supports the operation plate, a vibrating body which vibrates the operation plate, a base arranged opposite to the supporting plate through a space, and a frame body provided on the base so as to surround the operation plate and the supporting plate. The supporting plate includes an extending portion that extends outward from the operation plate. The frame body includes a protruding portion that protrudes inward so as to be opposed to the extending portion. The extending portion is connected to the protruding portion through a first variable member.

10 Claims, 10 Drawing Sheets

ELECTRONIC DEVICE AND MOBILE TERMINAL INCLUDING THE SAME

CROSS REFERENCE TO RELATED APPLICATIONS

This application is national stage application of International Application No. PCT/JP2011/079640, filed Dec. 21, 2011, which designates the United States, incorporated herein by reference, and which claims the benefit of priority from Japanese Patent Application No. 2011-006517, filed on Jan. 15, 2011, the entire contents of which are incorporated herein by reference.

FIELD OF INVENTION

The present invention relates to an electronic device and a mobile terminal including the same.

BACKGROUND

Recently, in an electronic device with a touch sensor, a tactile transmission technology for transmitting, when a user is operating the touch sensor, various tactile sensations such as a pressing feeling, a swipe feeling, and a touch feeling to the user has been known (see, for example, Patent Literature 1). An electronic device to which the tactile transmission technology is applied is provided in mobile terminals such as portable-type telephone set, music player, and personal computer. Therefore, in recent years, it has been required that the electronic device has a certain amount of dust-proof property and water-proof property.
Patent Literature 1: Japanese Patent Application Laid-open No. 2003-122507

SUMMARY

The present invention relates to an electronic device having a certain amount of dust-proof property and water-proof property, and a mobile terminal including the same.

According to one aspect of the present invention, an electronic device includes an operation plate, a supporting plate which supports the operation plate, a vibrating body which vibrates the operation plate, a base arranged opposite to the supporting plate through a space, and a frame body provided on the base so as to surround the operation plate and the supporting plate, the supporting plate including an extending portion that extends outward from the operation plate, the frame body including a protruding portion that protrudes inward so as to be opposed to the extending portion, and the extending portion connected to the protruding portion through a first variable member.

In one aspect of the mobile terminal according to the present invention, the electronic device according to the present invention is provided in a housing of the mobile terminal.

DETAILED DESCRIPTION OF THE PREFERRED EMBODIMENTS

Embodiments of the present invention will be explained below with reference to the drawings. The drawings hereinafter referred to depict simplified primary components which are required to explain the present invention among components according to an embodiment of the present invention, for convenience in explanation. Therefore, the electronic device and the mobile terminal including the same according to the present invention may include arbitrary components which are not illustrated in each of the drawings the present specification refers to.

Figure 1:
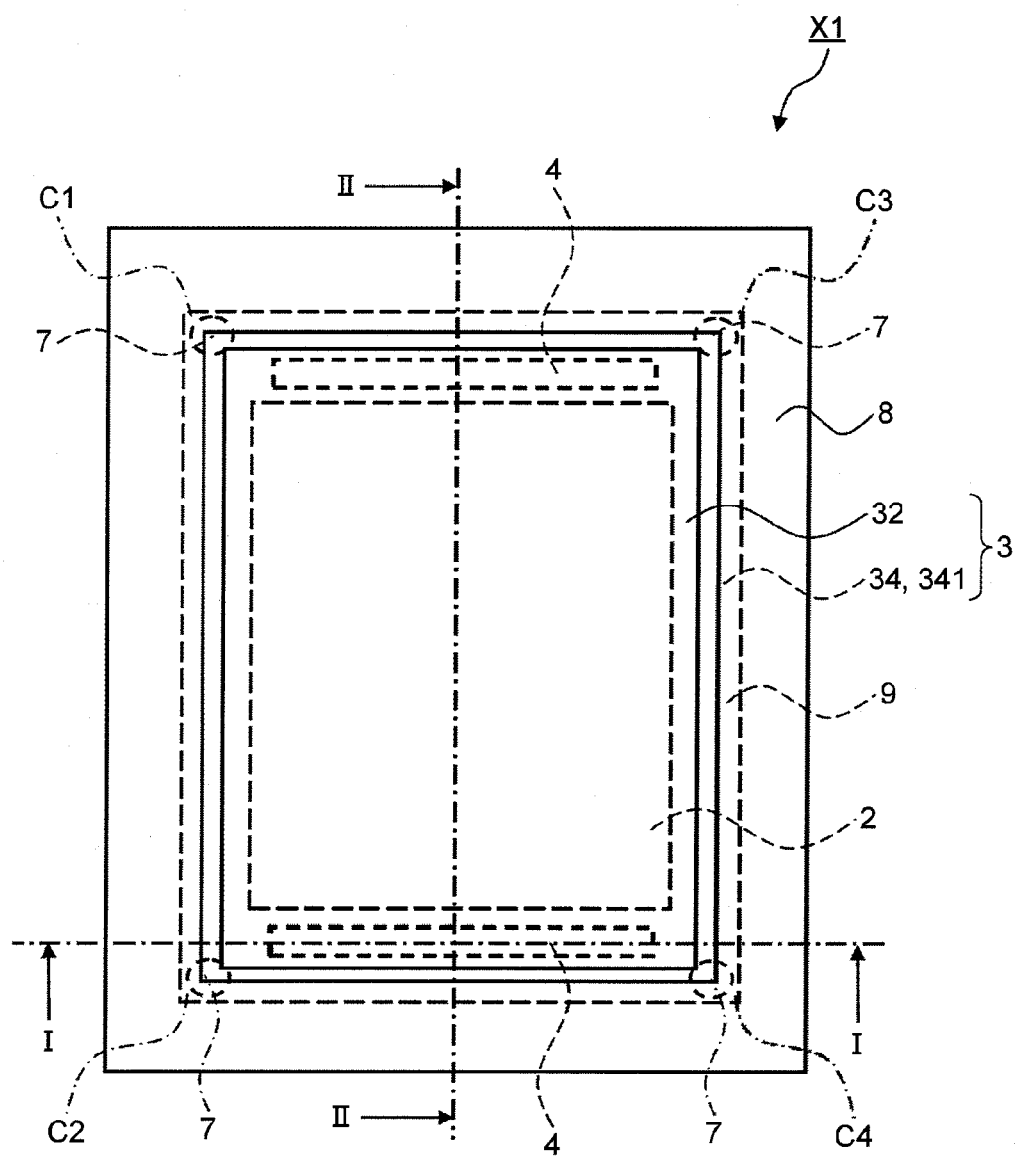
FIG. 1 is a plan view illustrating a schematic configuration of an electronic device according to a first embodiment.
Figure 2:
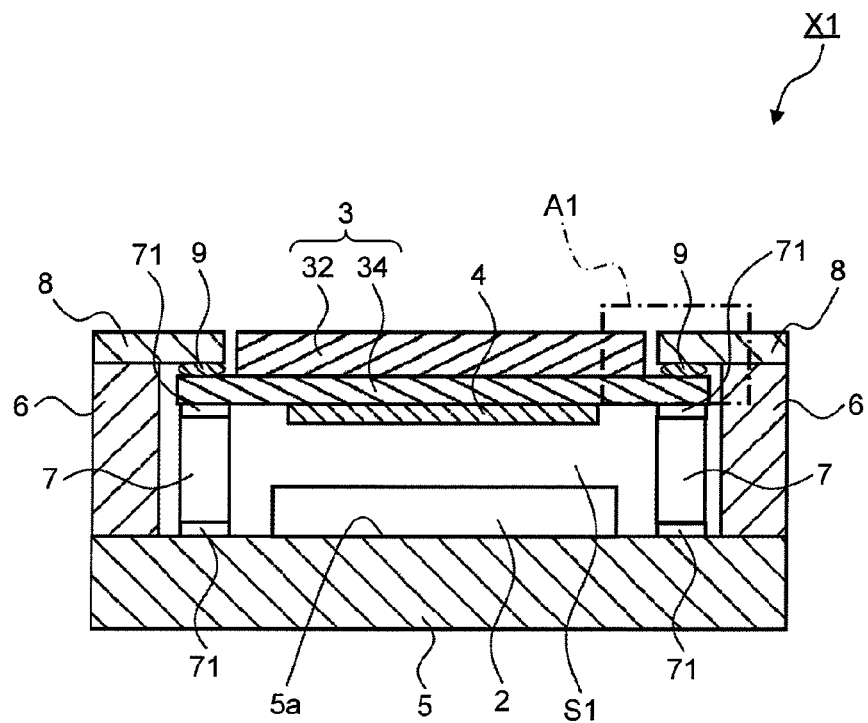
FIG. 2 is a cross-sectional view of the electronic device taken along cutting-plane line I-I illustrated in FIG. 1.
Figure 3:
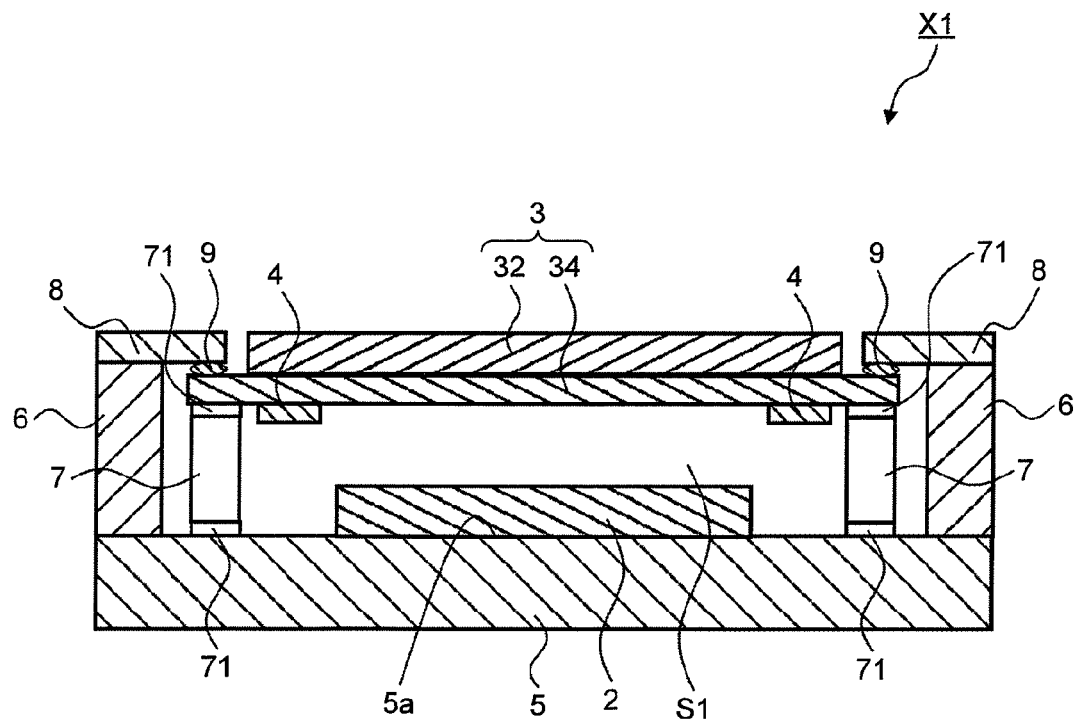
FIG. 3 is a cross-sectional view of the electronic device taken along cutting-plane line II-II illustrated in FIG. 1.

As illustrated in FIG. 1 to FIG. 3, an electronic device X1 according to the present embodiment includes a liquid crystal panel 2, a touch sensor 3, a vibrating body 4, a base 5, a frame body 6, a support 7, and a protruding portion 8.

The liquid crystal panel 2 is a display panel using a liquid crystal composition for display. Specifically, the liquid crystal panel 2 includes one substrate, another substrate arranged opposite to the one substrate, a liquid crystal layer provided between the one substrate and the other substrate, a display member layer provided between the one substrate and the other substrate and for contributing to display, and a backlight for irradiating light to the one substrate and the other substrate. For the sake of explanation, the one substrate, the other substrate, the liquid crystal layer, the display member layer, and the backlight are not illustrated in the figures. The display member layer is, for example, a pixel electrode, an alignment film, and a color filter. A drive system of the liquid crystal panel 2 may be a simple matrix drive system or may be an active matrix drive system.

A display panel such as a plasma panel, an organic EL panel, and an electronic paper may be used instead of the liquid crystal panel 2. The organic EL panel is a display panel using a material that emits light upon application of a voltage thereto. Specifically, the organic EL panel performs display by evaporating a luminescent material using an organic matter such as diamines on a substrate and applying a direct current voltage of 5 to 10 V to the substrate. The case of using the organic EL panel instead of the liquid crystal panel 2 does not require the backlight.

Figure 4:
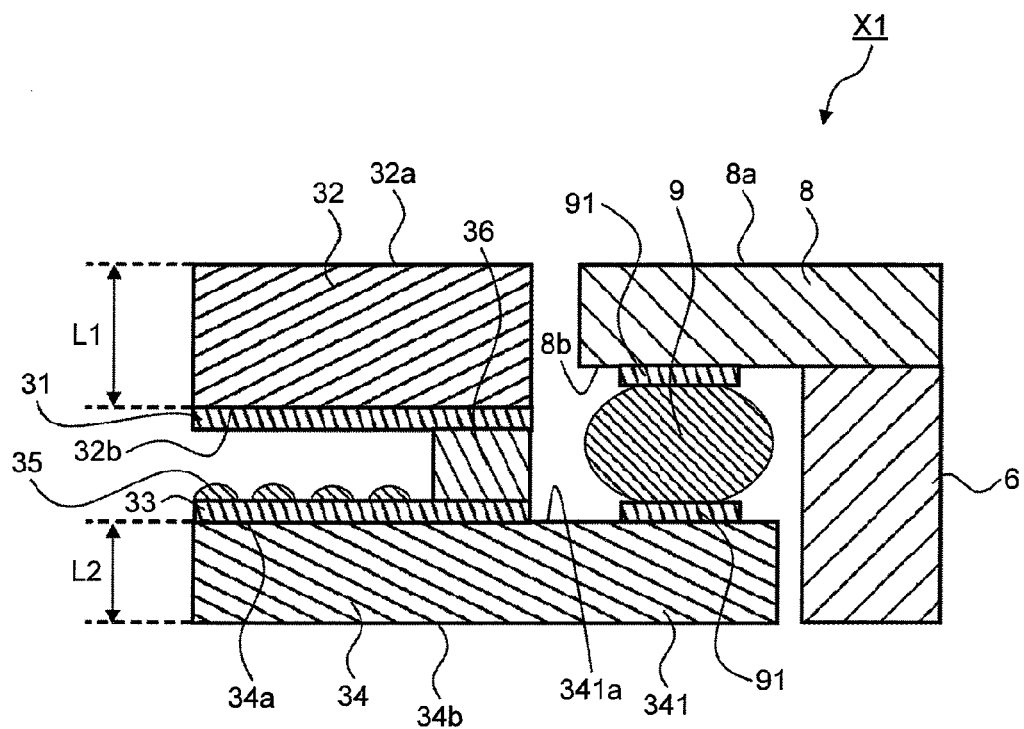
FIG. 4 is an enlarged view of a portion A1 illustrated in FIG. 2.

The touch sensor 3 is an input device that detects a location where a user performs an operation with a finger, a pen, or the like, as an input position. As illustrated in FIG. 2 and FIG. 3, the touch sensor 3 is disposed opposite to the liquid crystal panel 2 through a space 51. In the present embodiment, the touch sensor 3 is a resistive type touch sensor. Therefore, as illustrated in FIG. 4, the touch sensor 3 includes an upper-side detection electrode 31, an upper-side substrate 32, a lower-side detection electrode 33, a lower-side substrate 34, a spacer 35, and a seal member 36.

The upper-side detection electrode 31 is a member playing a role in contributing to detection of a potential at a contact point with the lower-side detection electrode 33 of the lower-side substrate 34. The upper-side detection electrode 31 has a translucency. The translucency mentioned in the present embodiment means that the upper-side detection electrode 31 has a permeability to visible light. A component material of the upper-side detection electrode 31 includes, for example, ITO (Indium Tin Oxide), ATO (Antimony Tin Oxide), tin oxide, or zinc oxide.

The upper-side substrate 32 functions as an operation plate with its upper surface 32a on which the user performs an input operation. The upper-side substrate 32 supports the upper-side detection electrode 31 with its lower surface (opposed surface to the lower-side substrate 34) 32b. The upper-side substrate 32 has a substantially rectangular shape in a planar view. The upper-side substrate 32 has a translucency and a flexibility. A component material of the upper-side substrate 32 includes, for example, glass or plastic.

The lower-side detection electrode 33 is a member playing a role in contributing to detection of a potential at a contact point with the upper-side detection electrode 31 of the upper-side substrate 32. The lower-side detection electrode 33 has a translucency. A component material of the lower-side detection electrode 33 includes the same as these of the upper-side detection electrode 31.

The lower-side substrate 34 functions as a supporting plate for supporting the upper-side substrate 32 with its upper surface (opposed surface to the upper-side substrate 32) 34a. The lower-side substrate 34 supports the lower-side detection electrode 33 with the upper surface 34a. The lower-side substrate 34 has a substantially rectangular shape in a planar view. The lower-side substrate 34 has a translucency. A component material of the lower-side substrate 34 includes, for example, glass or plastic. The lower-side substrate 34 has an extending portion 341 that extends outward from the upper-side substrate 32. In the present embodiment, the extending portion 341 extends outward from the entire periphery of the upper-side substrate 32.

The spacer 35 is a member playing a role, when the upper-side detection electrode 31 and the lower-side detection electrode 33 are in contact with each other at a predetermined position, in reducing occurrence of an unnecessary contact between the upper-side detection electrode 31 and the lower-side detection electrode 33 in any area other than the predetermined position. A component material of the spacer 35 includes, for example, a thermosetting resin or an ultraviolet-curable resin, and the thermosetting resin is preferable in terms of resistance to environment while the ultraviolet-curable resin is preferable in terms of productivity. The thermosetting resin includes, for example, an epoxy resin system, an unsaturated polyester system, a urea resin system, a melamine resin system, or a phenolic resin system. The ultraviolet-curable resin includes, for example, an acrylic resin system or an epoxy resin system.

The seal member 36 is a member playing a role in maintaining the upper-side substrate 32 and the lower-side substrate 34 at a predetermined space. The seal member 36 is located between the upper-side substrate 32 and the lower-side substrate 34, and is provided along the peripheral portions of the upper-side substrate 32 and the lower-side substrate 34. The seal member 36 is, for example, an adhesive material that includes a plurality of conductive particles within an insulating adhesive resin.

The vibrating body 4 is a member playing a role, when detecting a predetermined input operation performed by the user, in bending and vibrating the touch sensor 3. Specifically, the vibrating body 4 repeats an expanding-contracting motion in a short-side direction of the touch sensor 3 (a horizontal direction when FIG. 1 is viewed from above) to bend and vibrate the touch sensor 3 in the thickness direction of the touch sensor 3 (hereinafter, called "vertical direction"). The vibrating body 4 also has a role in detecting a pressure load on the touch sensor 3 although the details will be explained later. The vibrating body 4 is fixed to a lower surface 34b of the lower-side substrate 34 through an adhesive material which is not illustrated. In the present embodiment, the vibrating body 4 is, for example, a piezoelectric element for performing an expanding-contracting motion based on an applied voltage; however, the present embodiment is not limited thereto. An electromagnetic type vibrating body, a spring, a motor, or the like may be used instead of the piezoelectric element.

In the present embodiment, the vibrating body 4 is a piezoelectric element. Specifically, it is a unimorph type piezoelectric element. Therefore, the vibrating body 4 according to the present embodiment is configured in the following manner. That is, the vibrating body 4 is configured so that an electrode and an active layer are alternatively layered, and an inactive layer is provided in a place located near the lower surface 34b of the lower-side substrate 34. The active layer is formed from a piezoelectric material subjected to a polarization process. The inactive layer is formed from any one of a piezoelectric material, a metal material, and an insulating material, which are not subjected to a polarization process. A bimorph type piezoelectric element may be used instead of the unimorph type piezoelectric element.

In the present embodiment, as illustrated in FIG. 1 and FIG. 2, two units of the vibrating body 4 are arranged near both short sides of the touch sensor 3 along the respective short sides. The positions where the vibrating bodies 4 are arranged, the number thereof, and the like are not particularly limited. For example, two units of the vibrating body 4 may be arranged near both long sides of the touch sensor 3 along the respective long sides, or four units of the vibrating body 4 may be arranged near both long sides and short sides of the touch sensor 3 along the respective long sides and the respective short sides.

The base 5 and the frame body 6 are members playing a role in accommodating the liquid crystal panel 2. The base 5 has a primary surface 5a. The liquid crystal panel 2 is provided on the primary surface 5a of the base 5. That is, the liquid crystal panel 2 is provided between the lower-side substrate 34 in the touch sensor 3 and the base 5. In other words, the liquid crystal panel 2 may be provided directly on the primary surface 5a of the base 5 or may be provided on the primary surface 5a of the base 5 through an arbitrary member such as a circuit board. The frame body 6 is provided on the primary surface 5a of the base 5 so as to surround the liquid crystal panel 2 and the touch sensor 3. A component material of the base 5 and the frame body 6 includes resin such as polycarbonate and metal such as stainless steal, aluminum, and a magnesium alloy. The base 5 and the frame body 6 may be integrally formed or may be separately independently formed.

The support 7 is a member playing a role in supporting the touch sensor 3. In the present embodiment, the support 7 supports the touch sensor 3 with the lower surface 34b of the lower-side substrate 34. The support 7 is provided on the primary surface 5a of the base 5. Specifically, the support 7 is connected to the lower surface 34b of the lower-side substrate 34 and to the primary surface 5a of the base 5 each through a double-faced adhesive tape 71. In the present embodiment, the support 7 is located at four corners C1 to C4 of the lower-side substrate 34. The shape of the support 7 is, for example, a cylindrical shape, but it may be a rectangular cylindrical shape. The support 7 has an elasticity so as not to suppress vibration of the touch sensor 3. Therefore, a component material of the support 7 includes, for example, silicone rubber, urethane rubber, urethane foam, or other types of rubber.

In the explanation above, the support 7 has been explained using the example in which the support 7 is connected to the lower surface 34b of the lower-side substrate 34 and to the primary surface 5a of the base 5 each through the double-faced adhesive tape 71; however, the connection is not limited thereto. For example, the support 7 may be connected directly to the primary surface 5a of the base 5 without the double-faced adhesive tape 71. In addition, instead of the double-faced adhesive tape 71, any adhesive material may be used to connect the support 7 to the lower surface 34b of the lower-side substrate 34 and to the primary surface 5a of the base 5.

In the explanation above, the support 7 has been explained using the example in which the support 7 is located at the four corners C1 to C4 of the lower-side substrate 34; however, the location is not limited thereto. The support 7 may be located at each position between the corners C1 and C2 and between the corners C3 and C4 in addition to the four corners C1 to C4 of the lower-side substrate 34.

The protruding portion 8 is provided on the frame body 6. Specifically, the protruding portion 8 protrudes inward so as to be opposed to the extending portion 341 of the lower-side substrate 34. The frame body 6 and the protruding portion 8 may be integrally formed or may be separately independently formed. In the present embodiment, as illustrated in FIG. 4, an upper surface 341a of the extending portion 341 is connected to a lower surface 8b of the protruding portion 8 through a first variable member 9. Specifically, the first variable member 9 is connected to the lower surface 8b of the protruding portion 8 and to the upper surface 341a of the extending portion 341 each through double-faced adhesive tapes 91. The first variable member 9 itself may be a deformable bonding member (e.g., double-faced adhesive tape).

In the present embodiment, the first variable member 9 is provided so as to be located between the lower surface 8b of the protruding portion 8 and the upper surface 341a of the extending portion 341 and to surround the upper-side substrate 32. The first variable member 9 has an elasticity. A component material of the first variable member 9 includes silicone rubber, urethane rubber, urethane foam, other types of rubber, etc. Therefore, even if any dust or water enters the electronic device X1 from a space between the upper-side substrate 32 and the protruding portion 8, the first variable member 9 can reduce a possibility that the dust or the water enters the space 51 between the touch sensor 3 and the liquid crystal panel 2. Because of this, the electronic device X1 has a certain amount of dust-proof property and water-proof property. In order to further increase the water-proof property, a waterproof double-faced adhesive tape is preferably used as the double-faced adhesive tape 91.

To block the space between the upper-side substrate 32 and the protruding portion 8, a protective glass or a protective film may be provided on the upper surface 32a of the upper-side substrate 32 and an upper surface 8a of the protruding portion 8.

Figure 5:
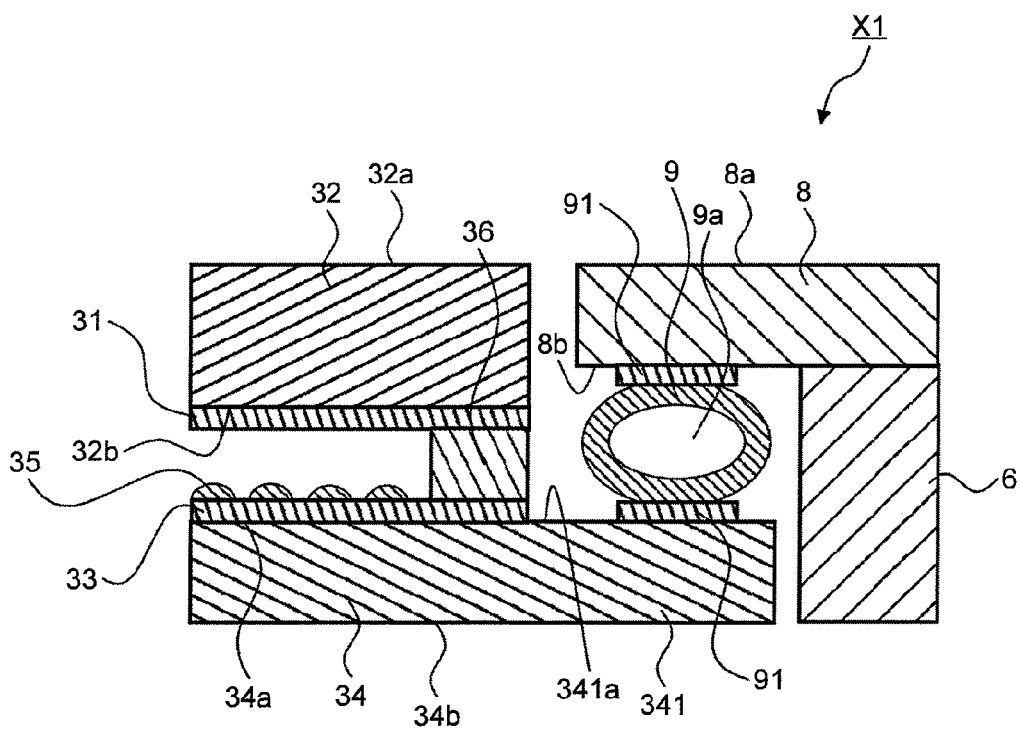
FIG. 5 is a cross-sectional view illustrating a modification of the electronic device according to the first embodiment and representing the same portion as that of FIG. 4.
Figure 6:
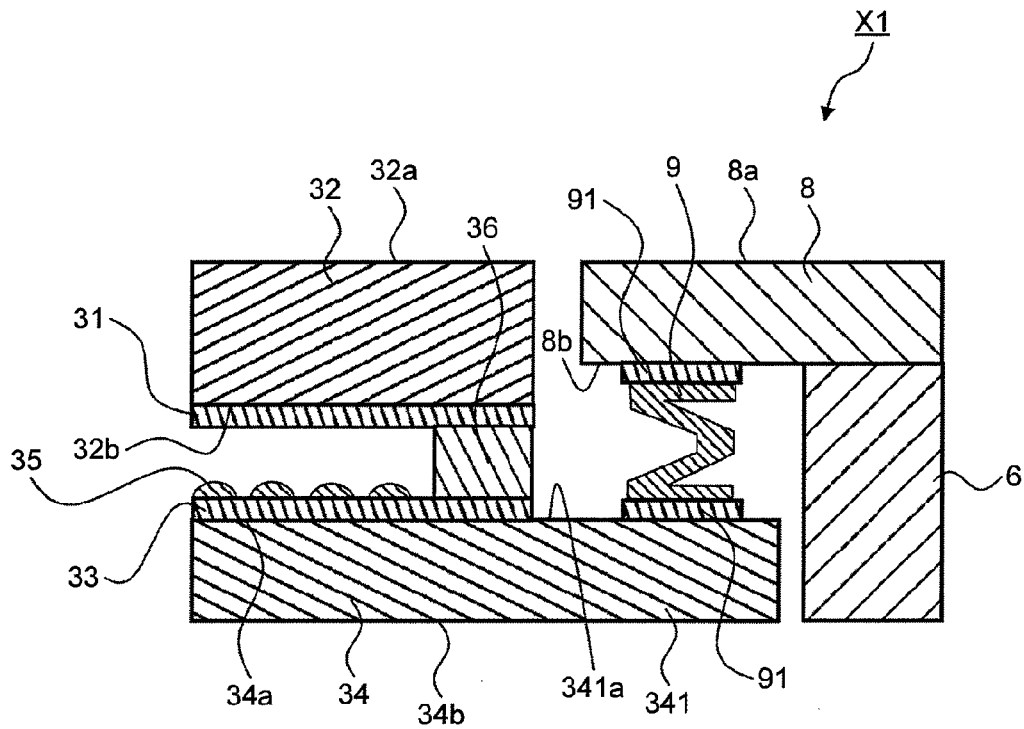
FIG. 6 is a cross-sectional view illustrating another modification of the electronic device according to the first embodiment and representing the same portion as that of FIG. 4.

Because the first variable member 9 is located between the lower surface 8b of the protruding portion 8 and the upper surface 341a of the extending portion 341, it is possible to reduce the suppression of the bending and vibration of the touch sensor 3. The reason is that the first variable member 9 can also vary in accordance with the bending and vibration of the touch sensor 3. The example in which the first variable member 9 has an elliptical shape in a cross-sectional view is illustrated in FIG. 2 to FIG. 4; however, the first variable member 9 is not limited thereto. In other words, in order to further reduce the suppression of the bending and vibration of the touch sensor 3 by the first variable member 9, a hollow 9a may be made in the first variable member 9 as illustrated in FIG. 5. In addition, in order to further reduce the suppression of the bending and vibration of the touch sensor 3 by the first variable member 9, the first variable member 9 may have an M shape in a cross-sectional view as illustrated in FIG. 6. Furthermore, the first variable member 9 may have a Z shape in a cross-sectional view.

It is preferable that the first variable member 9 be compressively held between the lower surface 8b of the protruding portion 8 and the upper surface 341a of the extending portion 341. Even if the user performs a pressing operation from the upper-side substrate 32 to the lower-side substrate 34, because it is compressively held, the first variable member 9 can sufficiently extend downward. In other words, any allowance can be given to the first variable member 9. This enables to reduce the possibility that the touch sensor 3 may deviate from the protruding portion 8.

As explained above, the electronic device X1 has a certain amount of dust-proof property and water-proof property, and can transmit satisfying tactile sensations to the user.

As illustrated in FIG. 2 to FIG. 4, it is preferable that a height position of the upper surface 32a of the upper-side substrate 32 and a height position of the upper surface 8a of the protruding portion 8 be substantially the same as each other. Therefore, in the present embodiment, as illustrated in FIG. 4, a thickness L1 of the upper-side substrate 32 is greater than a thickness L2 of the lower-side substrate 34. If the height position of the upper surface 32a of the upper-side substrate 32 and the height position of the upper surface 8a of the protruding portion 8 are substantially the same as each other, one principal plane of the electronic device X1 is formed as a planar surface, and design of the electronic device X1 is therefore improved.

An operation example of the electronic device X1 will be explained below with reference to FIG. 7.

The operation example of the electronic device X1 when a pressing feeling among tactile transmissions is transmitted to the user will be explained below; however, it goes without saying that the operation of the electronic device X1 can be applied to the case in which various tactile sensations such as the swipe feeling and the touch feeling in addition to the pressing feeling are transmitted.

Figure 7:
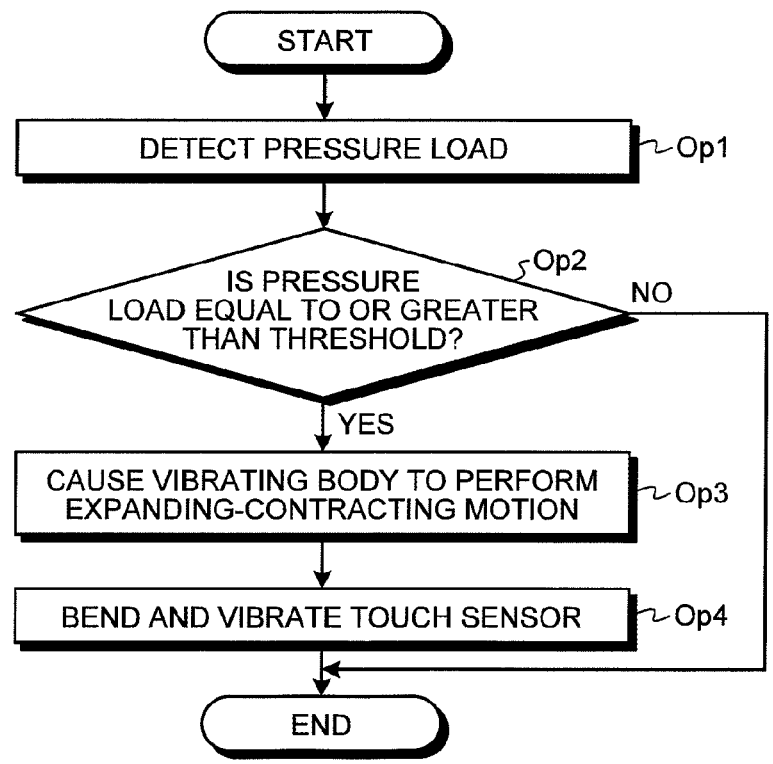
FIG. 7 is a flowchart illustrating an operation example of the electronic device.

As illustrated in FIG. 7, when the user presses the touch sensor 3, the vibrating body 4 detects a pressure load on the touch sensor 3 (Op1). A load detection function of the vibrating body 4 is explained herein. That is, when the user presses the touch sensor 3, the touch sensor 3 bends downward. When the touch sensor 3 bends downward, the vibrating body 4 also bends downward. In other words, a bending amount of the vibrating body 4 varies according to the pressure load on the touch sensor 3. In the present embodiment, the vibrating body 4 is a piezoelectric element and can therefore convert the pressure load to a voltage according to the bending amount. As a result, the pressure load on the touch sensor 3 can be detected by the vibrating body 4. The example of implementing the load detection function using the vibrating body 4 has been explained as above; however, the load detection function is not limited thereto. For example, the load detection function may be implemented by a load sensor such as a strain sensor.

When a user's input operation is a pressing operation on an input object displayed on a display screen, a tactile transmission driver, which is not illustrated, determines whether the pressure load detected at Op1 is equal to or greater than a threshold (Op2). The tactile transmission driver is provided on, for example, an FPC (Flexible Printed Circuit) connected to the touch sensor 3, together with a touch panel driver for controlling the touch sensor 3.

Then, when it is determined that the pressure load detected at Op1 is equal to or greater than a threshold (YES at Op2), the tactile transmission driver causes the vibrating body 4 to perform the expanding-contracting motion in the short-side direction of the touch sensor 3 (Op3). The vibrating body 4 expanded-contracted at Op3 then vertically bends and vibrates the touch sensor 3 (Op4). Thus, the pressing feeling is transmitted to the user who presses the touch sensor 3. Meanwhile, when it is determined that the pressure load detected at Op1 is less than the threshold (NO at Op2), the tactile transmission driver ends the processes in FIG. 7.

A mobile terminal P1 provided with the electronic device X1 will be explained below with reference to FIG. 8.

Figure 8:
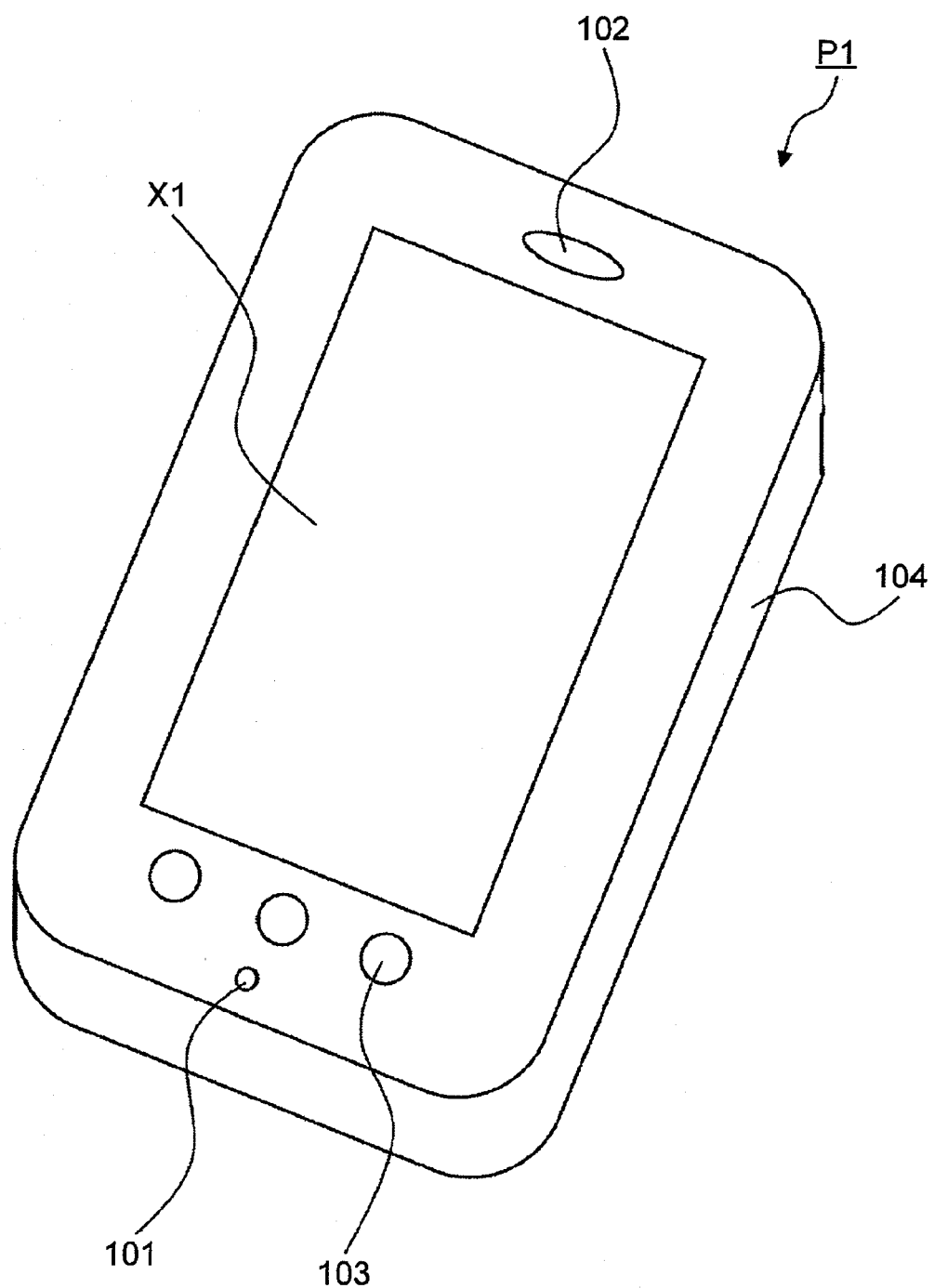
FIG. 8 is a perspective view illustrating a schematic configuration of a mobile terminal.

FIG. 8 is a perspective view illustrating a schematic configuration of the mobile terminal P1 according to the present embodiment. As illustrated in FIG. 8, the mobile terminal P1 is, for example, a mobile phone, a smartphone, or a PDA (Personal Digital Assistant), and includes the electronic device X1, a sound input unit 101, a sound output unit 102, a key entry unit 103, and a housing 104.

The sound input unit 101 includes, for example, a microphone, and inputs thereto user's voice or the like. The sound output unit 102 includes a speaker or the like, and outputs a voice of the other party or the like. The key entry unit 103 includes, for example, mechanical keys. The key entry unit 103 may be operation keys displayed on the display screen. The housing 104 is a member playing a role in accommodating the electronic device X1, the sound input unit 101, the sound output unit 102, and the key entry unit 103.

In addition to the above, the mobile terminal P1 may sometimes include a digital camera function unit, a One-Seg broadcast tuner, a near-field communication unit such as an infrared communication function unit, various interfaces, and the like, according to required functions. However, figures and explanation of the details of these units are omitted.

Because the electronic device X1 is provided, the mobile terminal P1 can transmit satisfying tactile sensations to the user while ensuring a certain amount of dust-proof property and water-proof property.

In the explanation above, the example of providing the sound input unit 101 in the mobile terminal P1 has been explained; however, the mobile terminal P1 is not limited thereto. In other words, the sound input unit 101 does not have to be provided in the mobile terminal P1.

In the explanation above, the example of providing the housing 104 for accommodating the electronic device X1 in the mobile terminal P1 has been explained; however, the mobile terminal P1 is not limited thereto. A mobile terminal may be configured that the base 5 and the frame body 6 in the electronic device X1 function as a housing without separately independently providing the housing 104.

Second Embodiment

Figure 9:
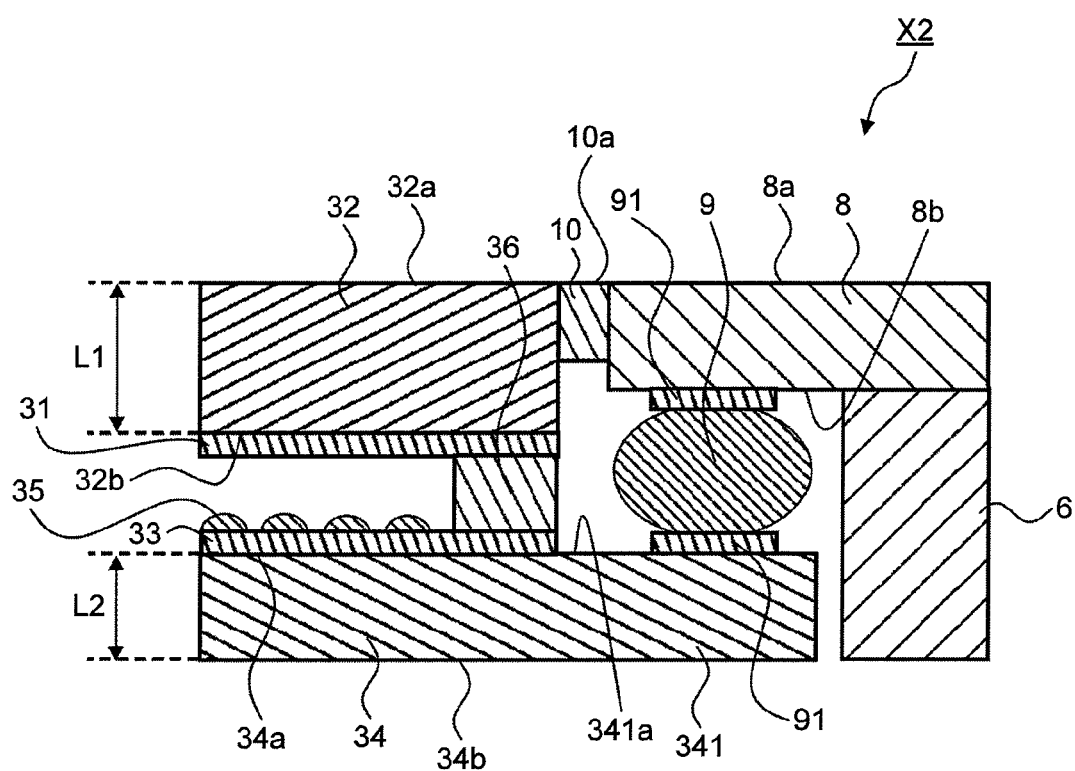
FIG. 9 is an enlarged cross-sectional view illustrating a schematic configuration of an electronic device according to a second embodiment and representing the same portion as that of FIG. 4.

FIG. 9 is an enlarged cross-sectional view illustrating a schematic configuration of an electronic device X2 according to the present embodiment. The same reference signs are assigned to the components of FIG. 9 having the same functions as these of FIG. 4, and detailed explanation thereof is omitted.

As illustrated in FIG. 9, the electronic device X2 includes a second variable member 10 between the upper-side substrate 32 and the protruding portion 8. The second variable member 10 has an elasticity similar to the first variable member 9. A component material of the second variable member 10 includes silicone rubber, urethane rubber, urethane foam, other types of rubber, etc.

In the present embodiment, a space between the upper-side substrate 32 and the protruding portion 8 is filled with the second variable member 10, and therefore it is possible to reduce the possibility that any dust or water may enter the electronic device X2 through the space between the upper-side substrate 32 and the protruding portion 8. Because the second variable member 10 is provided in addition to the first variable member 9, it is also possible to further reduce the possibility that any dust or water may enter the space 51 between the touch sensor 3 and the liquid crystal panel 2 as compared with the electronic device X1. In addition, because the second variable member 10 is provided between the upper-side substrate 32 and the protruding portion 8, it is possible to reduce the suppression of the bending and vibration of the touch sensor 3.

It is preferable that a height position of the upper surface 32a of the upper-side substrate 32, a height position of the upper surface 8a of the protruding portion 8, and a height position of an upper surface 10a of the second variable member 10 be substantially the same as one another. If the height position of the upper surface 32a of the upper-side substrate 32, the height position of the upper surface 8a of the protruding portion 8, and the height position of the upper surface 10a of the second variable member 10 are substantially the same as one another, one principal plane of the electronic device X2 is formed as a planar surface, and design of the electronic device X2 is therefore improved.

As explained above, the electronic device X2 has the dust-proof property and water-proof property more excellent as compared with these of the electronic device X1, and can transmit satisfying tactile sensations to the user.

In the explanation above, the example of separately independently forming the first variable member 9 and the second variable member 10 has been explained; however, the configuration is not limited thereto. The first variable member 9 and the second variable member 10 may be integrally formed. In this case, a variable member is provided between the upper-side substrate 32 and the protruding portion 8 and between the protruding portion 8 and the extending portion 341.

Third Embodiment

Figure 10:
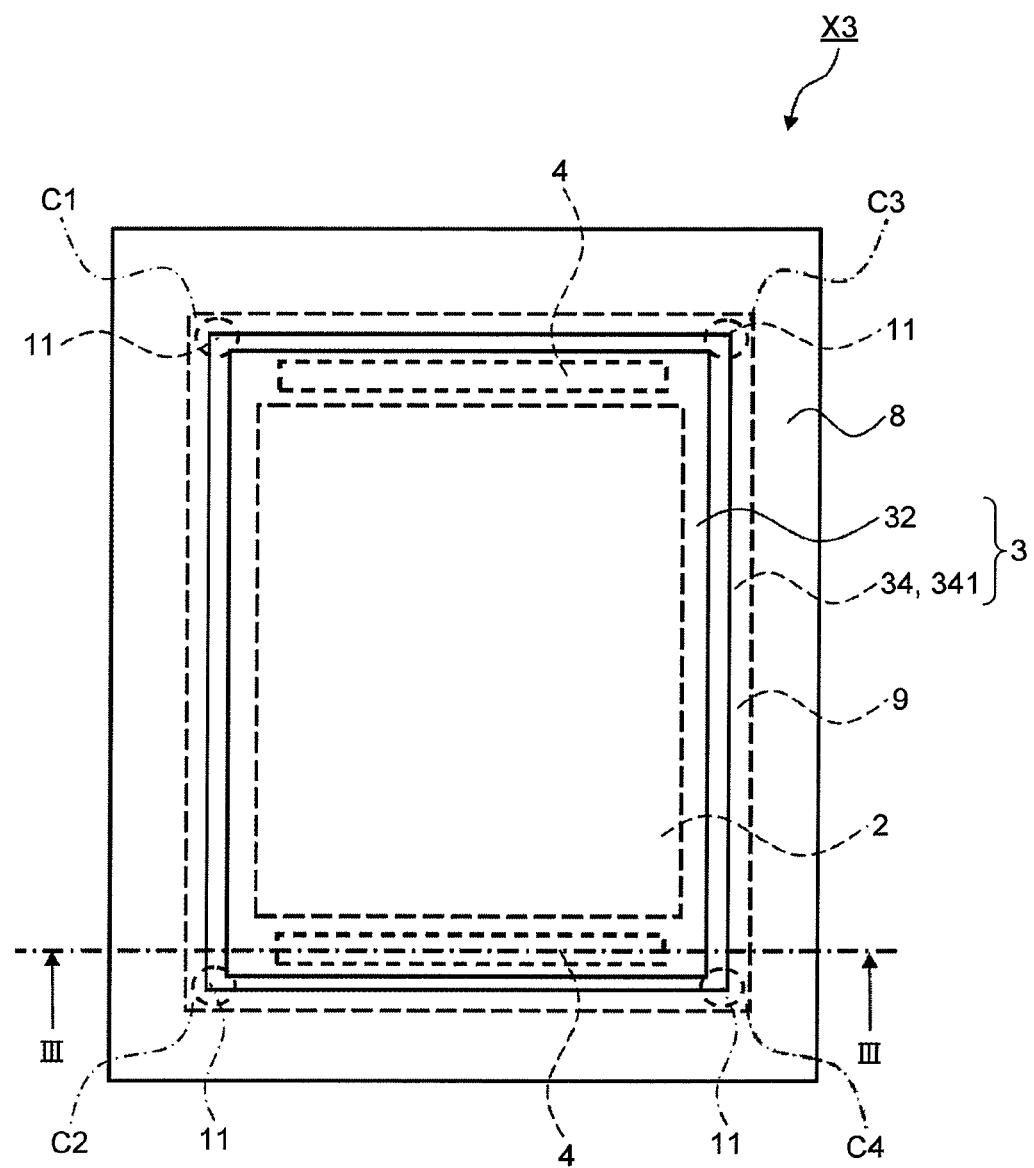
FIG. 10 is a plan view illustrating a schematic configuration of an electronic device according to a third embodiment.
Figure 11:
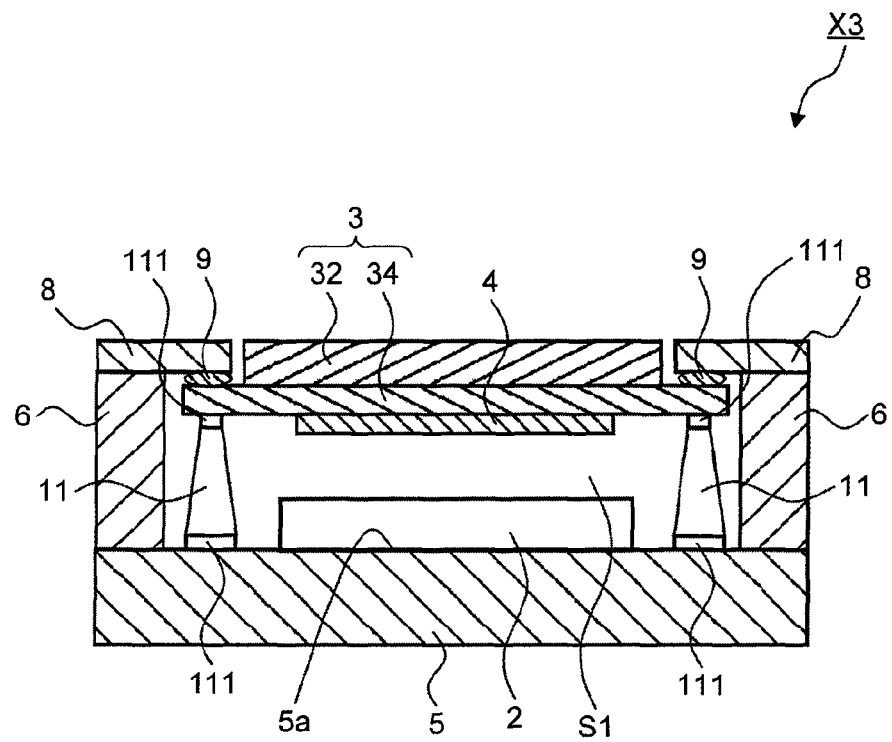
FIG. 11 is a cross-sectional view of the electronic device taken along cutting-plane line III-III illustrated in FIG. 10.
Figure 12:
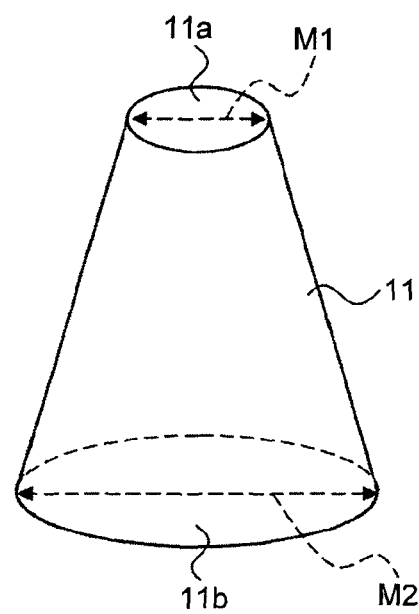
FIG. 12 is an enlarged view of a support.

FIG. 10 is a plan view illustrating a schematic configuration of an electronic device X3 according to the present embodiment. FIG. 11 is a cross-sectional view of the electronic device taken along cutting-plane line III-III illustrated in FIG. 10. FIG. 12 is an enlarged view of a support 11. The same reference signs are assigned to the components of FIG. 10 and FIG. 11 having the same functions as these of FIG. 1 and FIG. 2, and detailed explanation thereof is omitted.

As illustrated in FIG. 10 to FIG. 12, the electronic device X3 includes the support 11 instead of the support 7 explained in the first embodiment. A diameter M1 of a face 11a of the support 11 in contact with the lower surface 34b of the lower-side substrate 34 is smaller than a diameter M2 of a face 11b of the support 11 in contact with the primary surface 5a of the base 5. Specifically, the support 11 has a so-called tapered shape whose diameter becomes gradually larger along from the lower surface 34b of the lower-side substrate 34 toward the primary surface 5a of the base 5. By forming the support 11 in the above manner, a restrictive degree of the touch sensor 3 by the support 11 can be reduced. Therefore, the electronic device X3 can transmit more satisfying tactile sensations to the user as compared with the electronic device X1 explained in the first embodiment.

"Diameter of the face" mentioned above means, when the face is a circular shape in a planar view, the diameter of the circle, and means, when the face is a polygonal shape in a planar view, a diagonal line of the polygonal shape.

As explained above, the electronic device X3 has a certain amount of dust-proof property and water-proof property, and can transmit more satisfying tactile sensations to the user as compared with the electronic device X1.

Fourth Embodiment

Figure 13:
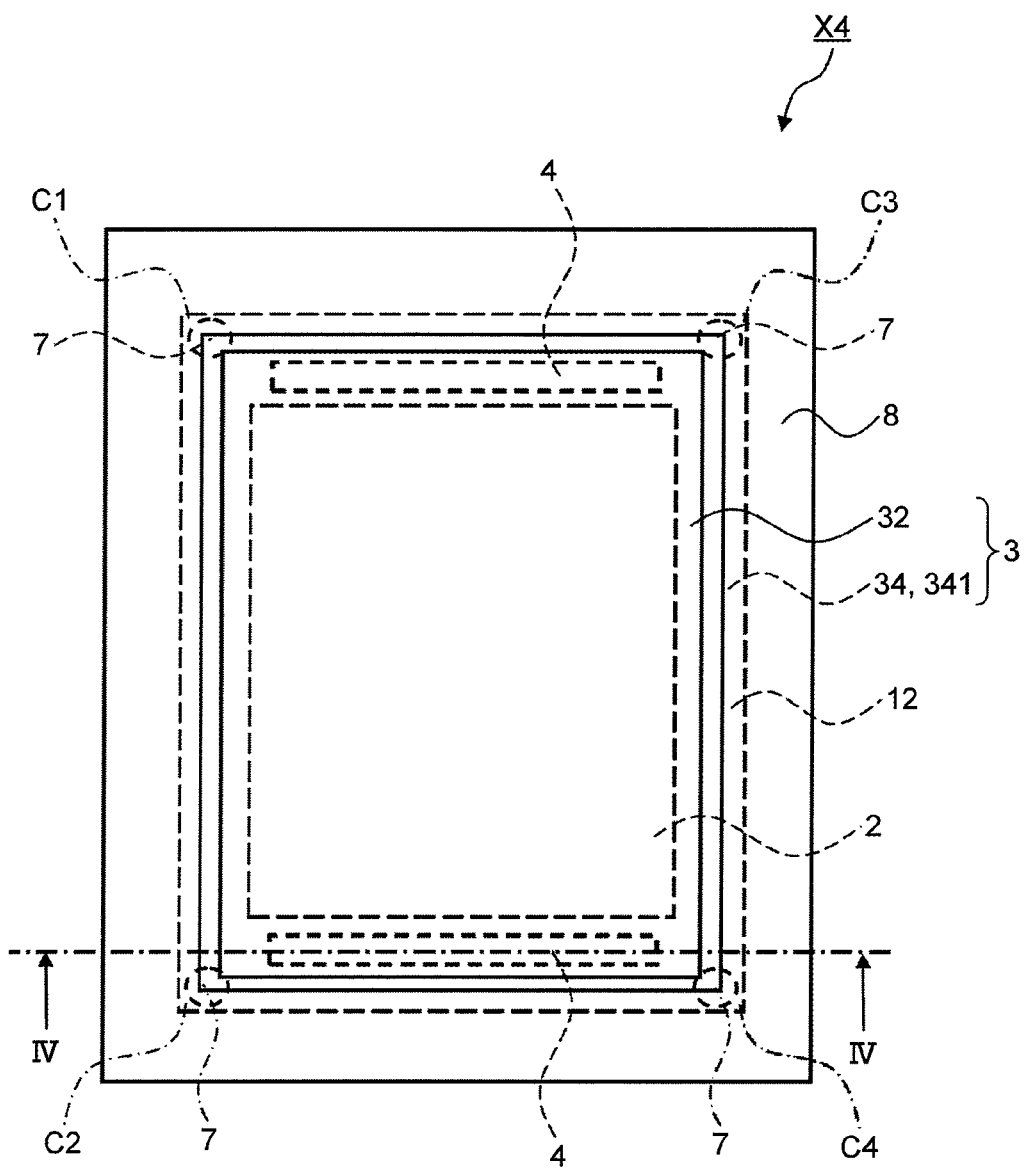
FIG. 13 is a plan view illustrating a schematic configuration of an electronic device according to a fourth embodiment.
Figure 14:
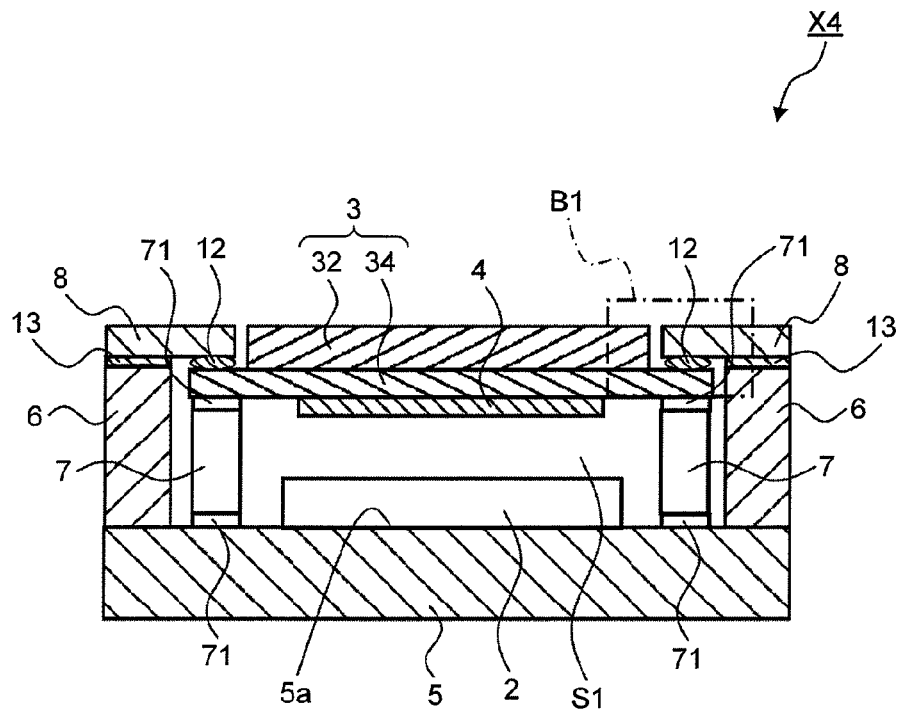
FIG. 14 is a cross-sectional view of the electronic device taken along cutting-plane line IV-IV illustrated in FIG. 13.
Figure 15:
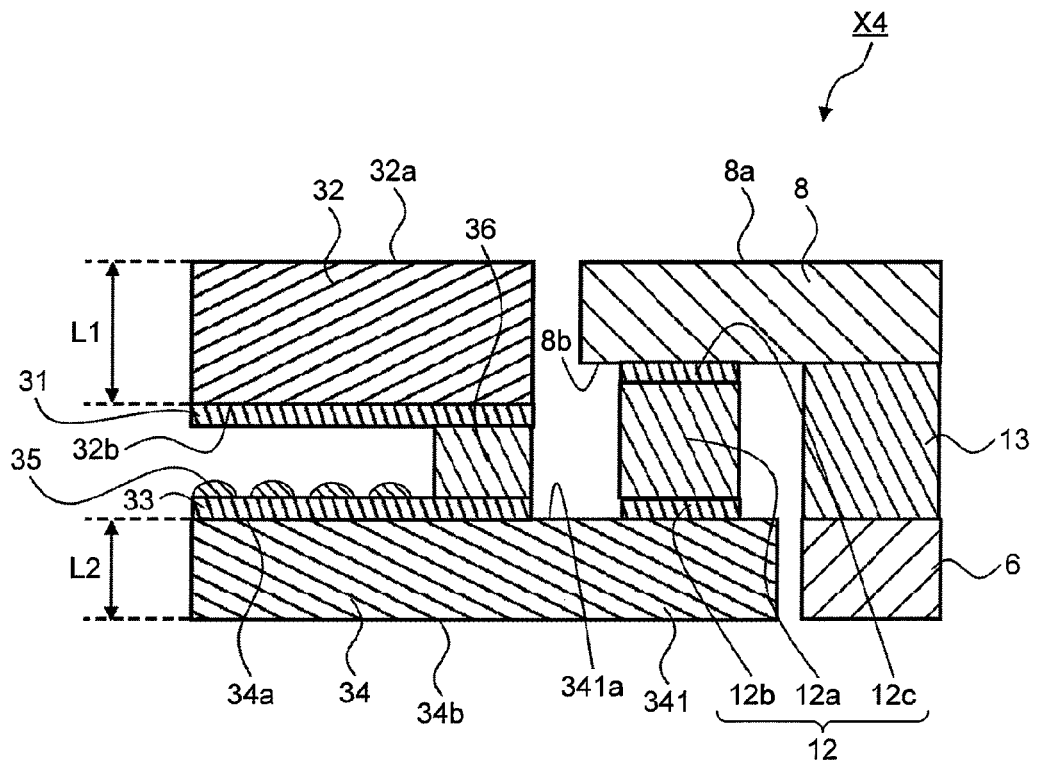
FIG. 15 is an enlarged view of a portion B1 illustrated in FIG. 14.

FIG. 13 is a plan view illustrating a schematic configuration of an electronic device X4 according to the present embodiment. FIG. 14 is a cross-sectional view of the electronic device taken along cutting-plane line IV-IV illustrated in FIG. 13. FIG. 15 is an enlarged view of a portion B1 illustrated in FIG. 14. The same reference signs are assigned to the components of FIG. 13 to FIG. 15 having the same functions as these of FIG. 1, FIG. 2, and FIG. 4, and detailed explanation thereof is omitted.

As illustrated in FIG. 13 to FIG. 15, the electronic device X4 includes a first variable member 12 instead of the first variable member 9 explained in the first embodiment. The first variable member 12 according to the present embodiment is formed from a double-faced adhesive tape. The double-faced adhesive tape has a certain degree of elasticity. The first variable member 12 has a base layer 12a, a first adhesion layer 12b, and a second adhesion layer 12c. A component material of the base layer 12a includes, for example, resin such as polyester. The first adhesion layer 12b has a function of bonding between the base layer 12a and the upper surface 341a of the extending portion 341. The second adhesion layer 12c has a function of bonding between the base layer 12a and the lower surface 8b of the protruding portion 8. A component material of the first adhesion layer 12b and the second adhesion layer 12c includes, for example, a polymer material such as an acrylic system, a silicon system, an urethane system, and a rubber system.

The electronic device X4 also includes a third variable member 13 provided between the frame body 6 and the protruding portion 8. The third variable member 13 has an elasticity higher than that of the first variable member 12. A component material of the third variable member 13 includes silicone rubber, urethane rubber, urethane foam, or other types of rubber.

The first variable member 12 has a certain degree of elasticity but may possibly suppress the bending and vibration of the touch sensor 3 to some extent because of the double-faced adhesive tape. However, in the present embodiment, the electronic device X4 is provided with the third variable member 13 between the frame body 6 and the protruding portion 8 in addition to the first variable member 12, and therefore the third variable member 13 can reduce the suppression of the bending and vibration of the touch sensor 3.

As explained above, the electronic device X4 has a certain amount of dust-proof property and water-proof property, and can transmit satisfying tactile sensations to the user.

The examples of the touch sensor 3 that includes the upper-side substrate 32 functioning as the operation plate and the lower-side substrate 34 functioning as the supporting plate have been explained in the first to the fourth embodiments; however, the configuration is not limited thereto. In other words, the supporting plate may be a touch sensor (touch sensors of various types such as a resistive type and a capacitive type), and the operation plate may be a protection plate (including one made of, for example, film or glass) for protecting the touch sensor. In addition, the supporting plate may be a display panel having a function of the touch sensor, and the operation plate may be a protection plate for protecting the display panel. The display panel having the function of the touch sensor includes, for example, a display panel with a built-in optical sensor having a position detection function.

The example of the mobile terminal P1 with the electronic device X1 has been explained in the first embodiment; however, any one of the electronic devices X2 to X4 may be used instead of the electronic device X1. Moreover, the first to the fourth embodiments may be combined with each other as appropriate.

Furthermore, the examples of applying the electronic devices X1 to X4 to the tactile transmission technology have been explained in the first to the fourth embodiments; however, the present invention is not limited thereto. The present invention can be applied to, for example, a speaker technology for bending and vibrating an operation plate to output a sound or a bone conduction technology capable of hearing sounds through bone conduction in addition to the tactile transmission technology. It goes without saying that the present invention can be also applied to a technology, of bone conduction technologies, capable of transmitting a sound by bringing any of the electronic devices X1 to X4 into contact with a user's ear directly or through any other object to transmit the vibration to ear cartilage.

REFERENCE SIGNS LIST

X1 to X4 ELECTRONIC DEVICE
P1 MOBILE TERMINAL
2 LIQUID CRYSTAL PANEL (DISPLAY PANEL)
3 TOUCH SENSOR
32 UPPER-SIDE SUBSTRATE (OPERATION PLATE)
34 LOWER-SIDE SUBSTRATE (SUPPORTING PLATE)
341 EXTENDING PORTION
4 VIBRATING BODY
5 BASE
6 FRAME BODY
7, 11 SUPPORT
8 PROTRUDING PORTION
9, 12 FIRST VARIABLE MEMBER
10 SECOND VARIABLE MEMBER
104 HOUSING

What is claimed is:
1. An electronic device comprising:
an operation plate;
a supporting plate for supporting the operation plate;

a vibrating body for vibrating the operation plate;
a base arranged opposite to the supporting plate through a space; and
a frame body provided on the base so as to surround the operation plate and the supporting plate, wherein
the supporting plate includes an extending portion that extends outward from the operation plate,
the frame body includes a protruding portion that protrudes inward so as to be opposed to the extending portion, and
the extending portion is connected to the protruding portion through a first variable member.

2. The electronic device according to claim 1, wherein
the extending portion extends outward from an entire periphery of the operation plate, and
the first variable member is provided so as to surround the operation plate.

3. The electronic device according to claim 1, wherein
the supporting plate has a substantially rectangular shape in a planar view, and further includes supports that support four corners of the supporting plate.

4. The electronic device according to claim 3, wherein
the support is provided on the base, and
a diameter of a face of the support in contact with the supporting plate is smaller than a diameter of a face of the support in contact with the base.

5. The electronic device according to claim 1, wherein the first variable member is compressively held between the extending portion and the protruding portion.

6. The electronic device according to claim 1, wherein a second variable member is provided between the operation plate and the protruding portion.

7. The electronic device according to claim 1, wherein a height position of an upper surface of the operation plate and a height position of an upper surface of the protruding portion are substantially same as each other.

8. The electronic device according to claim 1, further comprising a display panel between the supporting plate and the base.

9. A mobile terminal comprising the electronic device according to claim 1 provided in a housing.

10. A mobile terminal comprising the electronic device according to claim 1, wherein the base and the frame body function as a housing.

* * * * *